United States Patent [19]

Haggerty et al.

[11] Patent Number: 5,274,827
[45] Date of Patent: Dec. 28, 1993

[54] METHOD FOR EEPROM WRITE PROTECTION USING THRESHOLD VOLTAGE PROJECTION

[75] Inventors: Terry J. Haggerty, Noblesville; Curtis R. Balka, Kokomo; Ronald H. Jaeger, Indianapolis, all of Ind.

[73] Assignee: Delco Electronics Corporation, Kokomo, Ind.

[21] Appl. No.: 660,628

[22] Filed: Feb. 25, 1991

[51] Int. Cl.$^5$ ................................ G06F 1/28
[52] U.S. Cl. ...................... 395/750; 364/273.4;
364/DIG. 1; 364/948.5; 364/DIG. 2; 371/14;
371/66; 365/228
[58] Field of Search ............. 395/750, 575; 364/707,
364/485, 273.4, DIG. 1, 948.5, 965.76, DIG. 2;
371/13, 14, 66; 365/189.09, 228

[56] References Cited

U.S. PATENT DOCUMENTS

| | | | |
|---|---|---|---|
| 4,439,804 | 3/1984 | Riddle et al. | 361/92 |
| 4,485,456 | 11/1984 | Toyoda | 395/750 |
| 4,612,632 | 9/1986 | Olson | 371/66 |
| 4,843,592 | 6/1989 | Tsuaki et al. | 395/750 |

*Primary Examiner*—Michael R. Fleming
*Assistant Examiner*—Glenn A. Auve
*Attorney, Agent, or Firm*—A. Frank Duke; Jimmy L. Funke

[57] ABSTRACT

Writing to an EEPROM when the regulated supply voltage to the EEPROM is below a minimum voltage required for proper operation is prevented by determining the battery voltage threshold which corresponds to the minimum required supply voltage, measuring the battery voltage and the rate of change of voltage and projecting the voltage to the end of the write cycle. When the projected battery voltage is below the threshold the write cycle is canceled. The write cycle is also canceled when the battery voltage is below the normal operating range when a write cycle is requested.

7 Claims, 3 Drawing Sheets

METHOD FOR EEPROM WRITE PROTECTION USING THRESHOLD VOLTAGE PROJECTION

FIELD OF THE INVENTION

This invention relates to the secure use of nonvolatile memories and particularly to the prevention of writing to an EEPROM when the supply voltage is not adequate to support the procedure for the entire write cycle.

BACKGROUND OF THE INVENTION

Microcomputer based systems often use a non-volatile memory for permanent storage of data. A favorite type of memory for that purpose is an electrically erasable programmable read only memory (EEPROM). The process of programming or writing to an EEPROM is lengthy, on the order of 15 ms, which requires write periods thousands of times greater than writing to random access memory. To prevent corruption of data in the EEPROM it is necessary to maintain a minimum voltage throughout the write cycle. When the regulate voltage which supplies the microcomputer falls below its nominal value, the microprocessor can "get lost" while running code or can go through a reset. Either of these situations can corrupt the EEPROM data if the appropriate internal programming voltages were enabled at the time of the reset or the code getting lost.

The corruption of EEPROM data is of particular concern in applications where the information is critical and the power supply is not always reliable. One such application is in automotive vehicles which have a number of systems requiring long term memories and which may experience battery removal or other power supply failure just at the time when data is to be written to the non-volatile memory. Vehicle security systems, for example, may rely on security codes or status flags to determine whether a user is authorized and it is important that the stored information be valid. Many available microcomputers have hardware means for disabling writes to EEPROM when the voltage drops to some set level, but if this occurs during the write cycle the data may be corrupted.

SUMMARY OF THE INVENTION

It is therefore an object of the invention to provide a method of determining when a write cycle to an EEPROM may not be supported by the available supply voltage and preventing a write cycle at that time.

The invention is carried out in a microcomputer based system having an EEPROM wherein a minimum supply voltage is required for writing to the EEPROM, and the supply voltage is derived from battery voltage and is subject to decreasing at low battery voltage by the method of preventing a write cycle in the absence of adequate voltage comprising the steps of: determining the battery voltage threshold which corresponds to the required minimum supply voltage; measuring the battery voltage at the time for beginning the write cycle; determining the rate of battery voltage change; projecting the battery voltage to the end of the write cycle; and canceling the write cycle when the projected battery voltage at the end of the cycle is below the threshold voltage.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
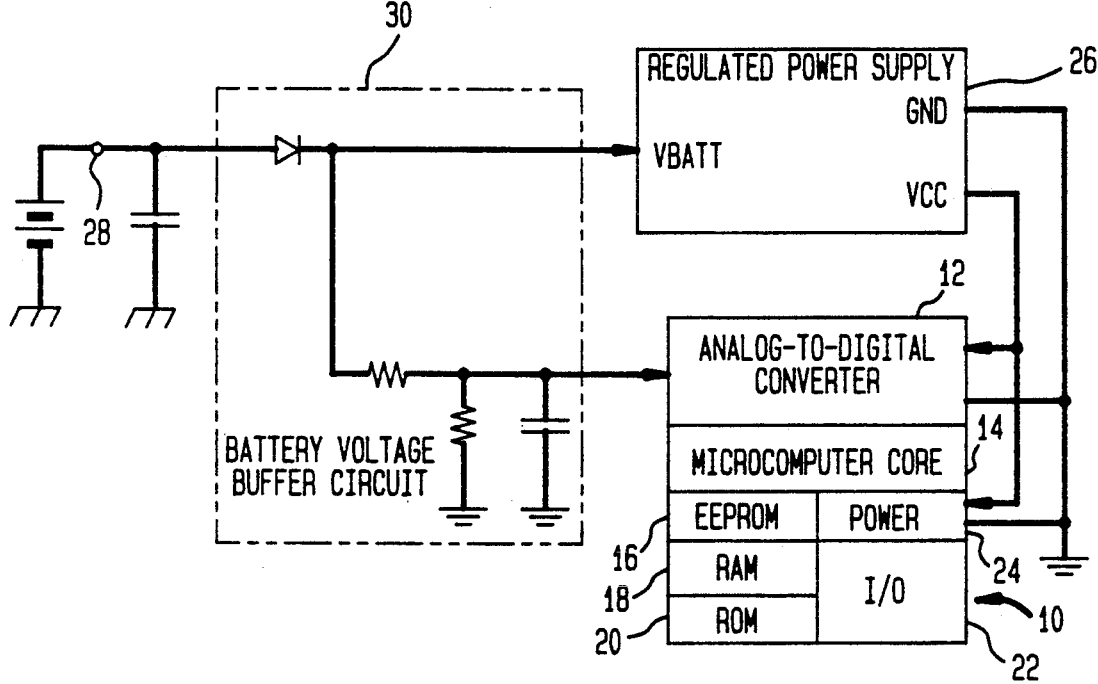
FIG. 1 is a schematic diagram of a microcomputer and power supply used in carrying out the invention.

Referring to FIG. 1, a microcomputer 10 incorporates an analog-to-digital (A/D) converter 12, a microcomputer core or central processor unit 14 having architecture for handling program instructions, a memory section including an EEPROM 16, a random access memory (RAM) 18, a read only memory (ROM) 20, an input/output port (I/O) 22, and an internal power supply 24 which includes a low voltage programming inhibit which cuts off power to the EEPROM programmer when battery voltage falls to a chosen low value, thereby preventing writes to EEPROM at such low voltage. An external regulated power supply 26 has an output which delivers regulated voltage Vcc to the A/D converter 12 and to the internal power supply 24. A ground line is also connected to the same elements. Battery voltage is supplied from a terminal 28 through a buffer circuit 30 to the power supply 26 and to the A/D converter 12. The converter 12 uses the Vcc voltage as a reference voltage to determine the value of the battery voltage.

Generally, in the case of an automotive system the battery produces 12 volts subject to fluctuations caused by various loads on the battery as well as charging circuitry. Occasionally, rather low battery voltages result, especially in the case of older batteries. The regulated power supply produces an output Vcc of typically 5 volts independently of small battery voltage variations so long as the battery voltage exceeds some value such as 6 volts, depending on the particular type of power supply. However, the battery may droop below 6 volts causing Vcc to droop as well. In the case of a battery disconnect or if a fuse is blown, the battery voltage can drop from its normal range to an unsafe level (below 6 volts) in 20 or 30 MS.

Figure 2:
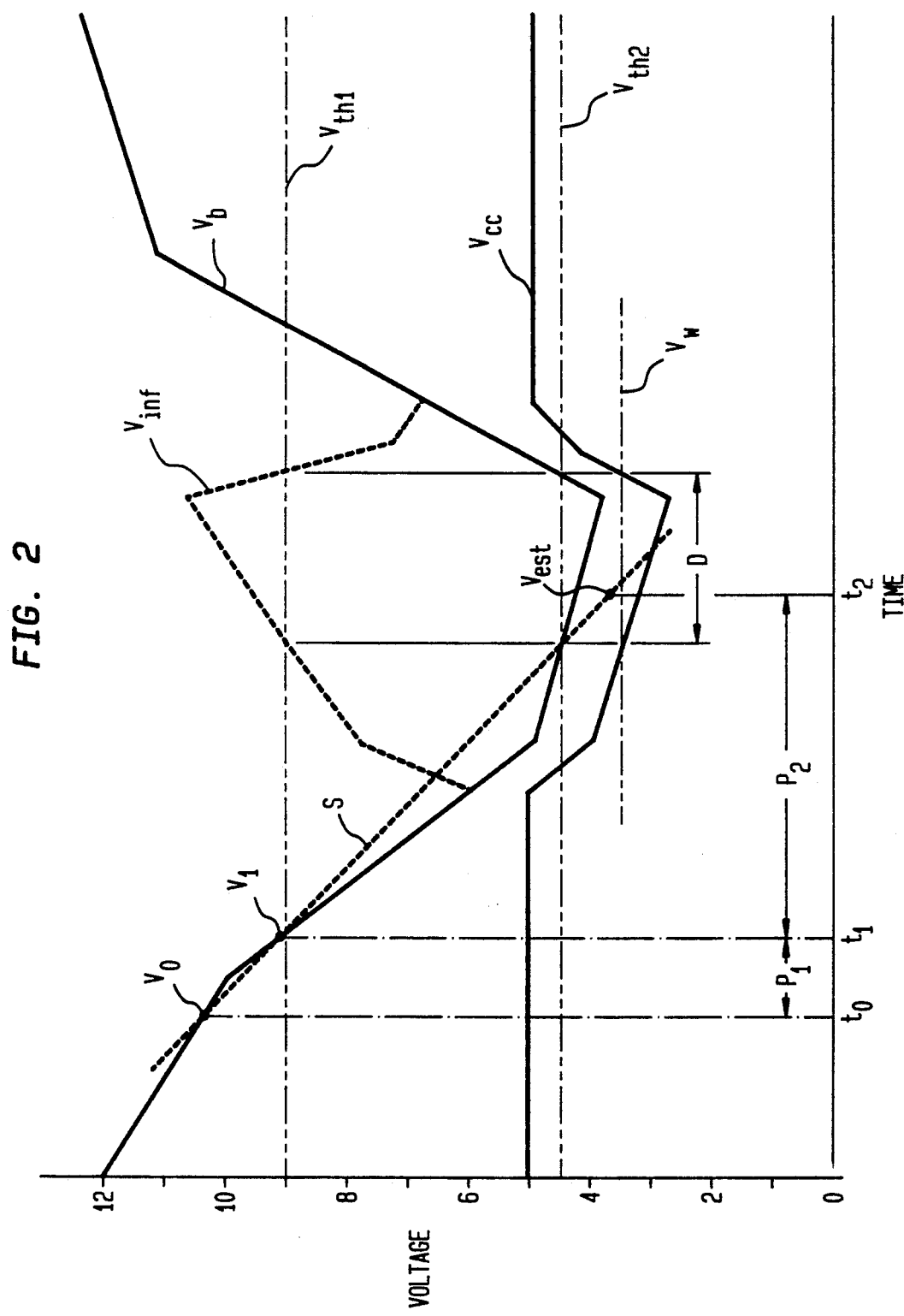
FIG. 2 is a graph of supply voltage for the microcomputer of FIG. 1.

The effect of the battery voltage Vb on the regulated voltage Vcc is shown by the graphs on FIG. 2. In writing to the EEPROM a minimum threshold voltage Vw must be maintained through the write cycle to assure valid data. The write threshold voltage vw is, for example, 3.5 volts. The battery voltage threshold Vth2 corresponding to the write threshold vw is, for example, 4.5 volts. For a given system, the value of Vth2 can be determined empirically. The write cycle must be completed when the battery voltage is at or above the battery threshold Vth2=4.5 volts.

Two tests are made to assure that during a write cycle to EEPROM the battery voltage Vb will not fall into the danger zone D where the battery voltage is less than the threshold Vth2. First, a voltage threshold Vth1 defining the lower limit of normal battery voltage is chosen. Typically this is Vth1=9 volts. If the voltage is below the threshold Vth1 when a write cycle is requested the write cycle is canceled. Second, if the voltage is declining, the slope is measured and the voltage is projected to the end of the write cycle. If the projected voltage is below the threshold Vth2 the write cycle is canceled and rescheduled.

By measuring the battery voltage Vb at regular periods and saving the most recent samples, the data necessary to determine the slope of the battery voltage is acquired. If, as shown in FIG. 2, a write request occurs at time t1, the voltage V1 at time t1 is measured and compared to the previous sample V0 taken at t0, where the period between t1 and t0 is P1. Then if the write period is P2, the voltage Vest at the end of the write cycle at time t2 can be estimated by the equation $Vest = V1 + [(V1-V0)/P1]P2$, as represented by sloped line S passing through the points V0 and V1 and having the slope $(V1-V0)/P1$. Where the period P1 and P2 are equal the equation reduces to the easily calculated form, $Vest = V1 + V1 - V0$.

The advantage of using the battery voltage to predict when the regulated voltage Vcc is below its write threshold is that the battery voltage begins to fall before the Vcc starts to fall so that an earlier and more accurate indication of the impending voltage drop is obtained. Moreover, an attempt to measure the voltage Vcc directly is difficult since the A/D converter 12 uses Vcc as a reference against which to compare other voltages when making the conversion. Thus Vcc will always be measured as full value even if it falls below the nominal 5 volt regulated level, unless a separate power supply immune to the battery voltage drop is used to supply the reference value to the A/D converter. Since the battery voltage Vb is determined by the A/D converter by comparing the external battery voltage to Vcc, the perceived battery voltage is inflated by the A/D converter when Vcc is less than 5 volts as shown by the dashed lines Vinf. By measuring the battery voltage Vb at times t0 and t1 before the Vcc drops, there is no reliance on the inflated voltage Vinf.

As shown in FIG. 2, the level of the normal threshold Vth1 has been chosen so that the inflated value of battery voltage vinf reaches Vth1 when the actual battery voltage Vb falls to the voltage threshold Vth2. The low voltage programming inhibit in the power supply 24 is set to disable the write to EEPROM when the battery voltage falls to threshold Vth2. This assures that during the danger zone D the software will not mistake an inflated voltage Vinf for actual voltage Vb.

Figure 3:
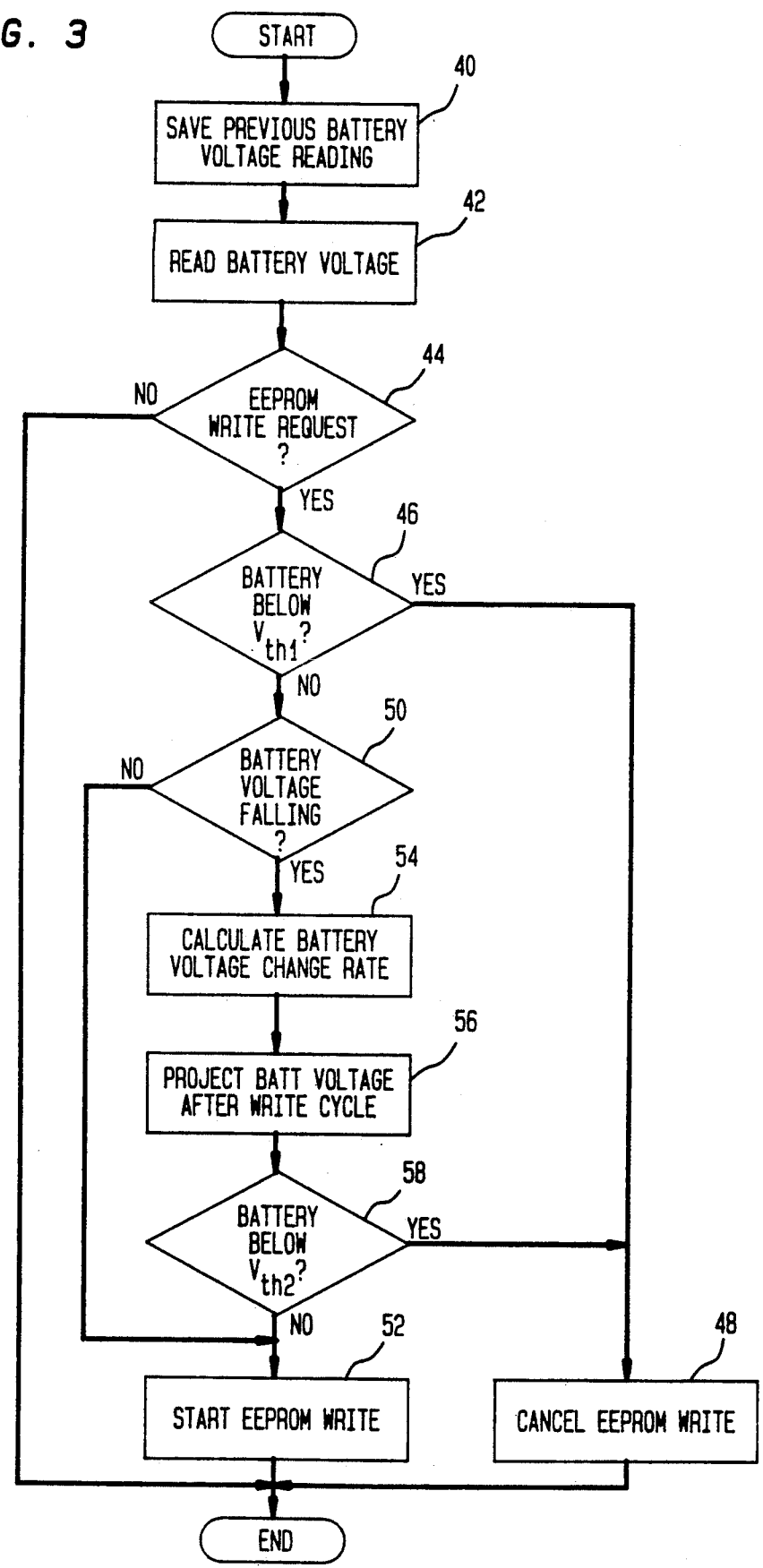
FIG. 3 is a flow chart of a write protect algorithm executed by the microcomputer of FIG. 1, according to the invention.

The program steps which carry out the method are set forth in the flow chart of FIG. 3. There the description uses the reference numerals nn of the flow chart blocks set in angle brackets <nn> to refer to the functions labeled in the blocks. The illustrated routine is executed periodically and the voltage V0 read on the previous run is saved <40> and the current battery voltage V1 is read <42>. If an EEPROM write request is present <44> the battery voltage V1 is compared to the threshold voltage Vth1. If it is lower than the threshold the EEPROM write cycle is canceled <48> but if it is not lower the battery voltage V1 is compared to the previous voltage V0 to determine if battery voltage is falling <50>. If it is not falling the EEPROM write cycle is begun <52> and if it is falling the battery voltage change rate is calculated on the basis of the voltages V1 and V0 and the period P1, which is determined by the frequency of executing this FIG. 3 routine. Then the battery voltage is projected to the end of the write cycle <56> on the basis of the voltage change rate and the write period. The projected voltage Vest is then compared to the threshold Vth2 <58> and if it is below that threshold the write cycle is canceled <48> but if it is not below that threshold the write cycle is commanded to begin <52>.

It will thus be seen that corruption of data written to EEPROM due to low regulated supply voltage can easily be prevented by simple unregulated battery voltage measurements and calculations to predict when such low supply voltage may occur during a write cycle and postponing a requested write cycle until the voltage conditions are more favorable, and by setting a hardware programming inhibit to render the system unable to begin a write cycle when the voltage is dangerously low.

The embodiments of the invention in which an exclusive property or privilege is claimed are defined as follows:

1. In a microprocessor based system having an EEPROM wherein a minimum supply voltage is required for writing to the EEPROM, and the supply voltage is derived from battery voltage and decreases when the battery voltage drops below a known low voltage; the method of preventing a write cycle in the absence of adequate voltage comprising the steps of:
   determining a battery voltage threaded which correspond to the required minimum supply voltage;
   measuring the battery voltage at the time for beginning the write cycle;
   determining a time rate of change for the battery voltage; projecting the battery voltage to the end of the write cycle; and
   canceling the write cycle when the projected battery voltage at the end of the cycle is below the battery voltage threshold.

2. In a microprocessor based system having an EEPROM wherein a minimum supply voltage is required for writing to EEPROM, and the supply voltage is derived from battery voltage and decreases when the battery voltage drops below a known low voltage; the method of preventing a write cycle in the absence of adequate voltage comprising the steps of:
   determining a battery voltage minimum threshold which corresponds to the required minimum supply voltage;
   measuring the battery voltage at a time prior to beginning a write cycle;
   calculating a time rate of change for the battery voltage;
   projecting the battery voltage to the end of the write cycle;
   canceling the write cycle when the projected battery voltage at the end of the write cycle is below the battery voltage minimum threshold; and
   starting the write cycle when the projected battery voltage at the end of the cycle is at or above the battery voltage minimum threshold.

3. The invention as defined in claim 2 including the steps of:
   establishing a normal voltage threshold;
   comparing the battery voltage at the beginning of the write cycle to the normal voltage threshold; and
   canceling the write cycle when the battery voltage at the beginning of the write cycle is less than the normal threshold voltage.

4. The invention as defined in claim 3, wherein the system includes an A/D converter subject to producing inflated perceived battery voltage above a normal battery voltage threshold when battery voltage is below the battery voltage minimum threshold and means responsive to battery voltage for disabling the write cycle, including the step of disabling the write cycle when the battery voltage falls below the battery voltage minimum threshold.

5. In a microprocessor based system having an EEPROM wherein a minimum supply voltage is required for writing to the EEPROM, and the supply voltage is derived from battery voltage and decreases when the battery voltage drops below a known low voltage; the method of preventing a write cycle in the absence of adequate voltage comprising the steps of:

determining a battery voltage threshold which corresponds to the required minimum supply voltage;

measuring a battery voltage V0 at a period P1 prior to beginning a write cycle;

measuring a battery voltage V1 at a time for beginning the write cycle;

estimating a projected battery voltage Vest at the end of the write cycle by the equation $Vest = V1 + ((V1-V2)/P1)P2$ where P2 is the EEPROM write period; and canceling the write cycle when the projected battery voltage at the end of the write cycle is below the battery voltage threshold.

6. The invention as defined in claim 5 wherein the periods P1 and P2 are equal and the estimated battery voltage is calculated by the equation $Vest = V1 + V1 - V0$.

7. The invention as defined in claim 5 wherein the system has hardware for disabling the write cycle when the battery voltage falls below a limit voltage, including the step of setting the limit voltage to prevent a write cycle when battery voltage is below the battery voltage threshold.

* * * * *